(12) United States Patent
Nicolas (10) Patent No.: US 9,701,533 B2
(45) Date of Patent: Jul. 11, 2017

(54) PACKAGE STRUCTURE INCLUDING A CAVITY COUPLED TO AN INJECTION GAS CHANNEL COMPOSED OF A PERMEABLE MATERIAL

(71) Applicant: Commissariat a l'energie atomique et aux energies alternatives, Paris (FR)

(72) Inventor: Stephane Nicolas, Meylan (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/938,118

(22) Filed: Nov. 11, 2015

(65) Prior Publication Data

US 2016/0137487 A1 May 19, 2016

(30) Foreign Application Priority Data

Nov. 13, 2014 (FR) ...................................... 14 60950

(51) Int. Cl.
*B81B 7/00* (2006.01)
*B81C 1/00* (2006.01)

(52) U.S. Cl.
CPC ........ *B81B 7/0038* (2013.01); *B81C 1/00285* (2013.01); *B81B 2201/0235* (2013.01);
(Continued)

(58) Field of Classification Search
CPC ............ B81B 7/0038; B81B 2207/097; B81B 2201/0242; B81B 2201/0235;
(Continued)

(56) References Cited

U.S. PATENT DOCUMENTS 7,659,150 B1 2/2010 Monadgemi et al.
8,350,346 B1 1/2013 Huang et al.
(Continued)

FOREIGN PATENT DOCUMENTS

EP 2 692 689 A2 2/2014
EP 2 778 121 A1 9/2014
(Continued)

OTHER PUBLICATIONS

French Preliminary Search Report issued May 29, 2015 in French Application 14 60950, filed on Nov. 13, 2014.

*Primary Examiner* — Fernando L Toledo
*Assistant Examiner* — Adam S Bowen
(74) *Attorney, Agent, or Firm* — Oblon, McClelland, Maier & Neustadt, L.L.P.

(57) ABSTRACT

A packing structure including:
a cap secured to at least one first substrate and forming at least one cavity between the cap and the first substrate;
a layer of at least one first material permeable to a gas, arranged in the cap and/or in the first substrate and/or at the interface between the cap and the first substrate, and forming at least one part of a wall of the cavity;
a portion of at least one second material non-permeable to said gas, the thickness of which is higher than or equal to that of the layer of the first material, and surrounding at least one first part of the layer of the first material forming said part of the wall of the cavity;
an aperture passing through the cap or the first substrate and opening onto or into said part of the layer of the first material.

18 Claims, 10 Drawing Sheets

(52) U.S. Cl.
   CPC . *B81B 2201/0242* (2013.01); *B81B 2207/097* (2013.01); *B81C 2203/0109* (2013.01); *B81C 2203/0118* (2013.01); *B81C 2203/0145* (2013.01)

(58) Field of Classification Search
   CPC ........ B81C 1/00285; B81C 2203/0109; B81C 2203/0118; B81C 2203/0145
   USPC ........................................................ 257/415
   See application file for complete search history.

(56)  References Cited

U.S. PATENT DOCUMENTS

| | | | |
|---|---|---|---|
| 9,023,675 B2 | 5/2015 | Nicolas | |
| 9,139,424 B2 | 9/2015 | Nicolas et al. | |
| 2007/0259470 A1* | 11/2007 | Quenzer | B81B 7/0077 438/50 |
| 2012/0326248 A1 | 12/2012 | Daneman et al. | |
| 2015/0259196 A1* | 9/2015 | Nakamura | B81B 7/0038 257/415 |

FOREIGN PATENT DOCUMENTS

| | | |
|---|---|---|
| FR | 2 841 380 A1 | 12/2003 |
| WO | WO 2005/078458 A1 | 8/2005 |

\* cited by examiner

PACKAGE STRUCTURE INCLUDING A CAVITY COUPLED TO AN INJECTION GAS CHANNEL COMPOSED OF A PERMEABLE MATERIAL

TECHNICAL FIELD AND PRIOR ART

The invention relates to the field of packaging, in particular for MEMS (micro-electro-mechanical systems), NEMS (nano-electro-mechanical systems), MOEMS (micro-opto-electro-mechanical systems), NOEMS (nano-opto-electro-mechanical systems)-type micro-devices, or also pressure sensors, in hermetic cavities and under particular atmospheres.

The packaging of a micro-device in a cavity enables it on the one hand to be protected against external elements (humidity, particulate pollution, reactive elements such as oxygen or other non-neutral gases), and on the other hand, the atmosphere in which the micro-device is packaged to be controlled, both in terms of pressure and gas composition.

Pressures with which the micro-devices are packaged are very variable depending on their application and are typically between about 1 bar and $10^{-3}$ mbar. A recurrent requirement during such a packaging is thus to make a very accurate monitoring of the pressure with which the micro-device is packaged. For example, in the case of a gyrometer-type MEMS micro-device, a vacuum corresponding to a pressure between about $10^{-1}$ and $10^{-3}$ mbar is generally required for its good working order. In the case of an accelerometer-type MEMS micro-device, a packaging pressure between a few mbars and the atmospheric pressure is desired, depending on the desired damping.

A simultaneous packaging of several micro-devices is generally made at the scale of the substrate, that is by a collective packaging method, in order to reduce their manufacturing cost. For this, it is possible to collectively make these micro-devices on wafers (or substrates) of silicon and then to package them in cavities via transferring a cap generally corresponding to another substrate of silicon or of glass in which the cavities are etched. There are different sealing techniques enabling a hermetic assembly of two substrates to be achieved, as for example molecular sealing, metal sealing, anodic sealing, or also sintered glass sealing.

The packaging may also be made by one or more thin layers deposited onto sacrificial portions covering the micro-devices and which, after being removed, form free volumes between the substrate and the thin layers corresponding to the cavities ("Thin Film Packaging" also called TFP).

The main parameters to be taken into account for monitoring the pressure in the cavity are:
  the hermeticity of the sealing joint possibly present between the substrates;
  the gas permeation through the walls of the cavity which are formed by the substrates and/or the sealing joint;
  the degassing of the different materials present in the cavity.

There are particular components, called inertial units, each comprising a three-axis accelerometer, a three-axis gyrometer as well as a three-axis magnetometer, thus forming an inertial sensor with 9 detection axes. For this type of component, triaxial microelectronic devices (accelerometer, gyrometer and magnetometer) are generally manufactured independently from each other and then assembled during the final packaging of the component, which corresponds in this case to a non-collective packaging method. For reasons of reduction of the manufacturing costs of this type of component, it is contemplated to integrate the different microelectronic devices of the component on a same substrate. However, this type of integration raises problems.

Indeed, an accelerometer generally operates with a residual pressure (pressure within the packaging cavity) which is quite high (higher than about 1 mbar) in order to be sufficiently damped, whereas a gyrometer generally needs the lowest possible residual pressure (for example between about $10^{-4}$ mbar and $10^{-4}$ mbar) to optimally operate. But, it is very difficult to package and hermetically seal cavities with very different residual pressures on a same substrate.

A first solution consists in making a sealing of the cavities of the accelerometer and gyrometer under a very low pressure (for example between about $10^{-3}$ mbar and $10^{-5}$ mbar), putting a getter material in the cavity of the gyrometer and not putting the same in the cavity of the accelerometer. This first solution is operational but does not enable significant pressure differences to be reached between both cavities: typically, the residual pressure in the cavity of the accelerometer is between a few mbars and a few tens mbars because of degassing of the different materials contained in the cavity of the accelerometer upon sealing. But, for some accelerometers, it is required to have a residual pressure higher than about 100 mbars or even close to about 1 bar (strong damping). In this case, this first solution is not operational.

A second solution consists in making the sealing of both cavities under an atmospheric pressure (for example at a pressure of about 1 bar), and putting a getter material in the cavity of the gyrometer. However, because of the limited pumping capacity and the limited overall size of the getter material (the maximum size of which is limited by the dimensions of the cavity), it is generally not possible to get down to a residual pressure lower than about 1 mbar in the cavity of the gyrometer because the getter is saturated before reaching such a pressure.

Regardless of the chosen solution (low pressure or atmospheric pressure sealing), one of both devices is not packaged with a residual pressure corresponding to that required to its good working order.

Document 8 350 346 B1 describes a component including cavities with different volumes in which a gyrometer and an accelerometer are packaged. The volume of the cavity in which the accelerometer is packaged is lower than that of the cavity in which the gyrometer is packaged. Thus, the pressure achieved in the cavity of the accelerometer is higher than that achieved in the cavity of the gyrometer. However, such a structure does not enable pressure differences ranging from 1 bar to $10^{-3}$ mbar between the different cavities to be achieved.

Document U.S. Pat. No. 7,659,150 B1 describes a packaging structure including several cavities wherein several micro-devices are packaged. Different pressures are achieved in these cavities thanks to apertures having different sizes formed through the cap and directly opening into the cavities. In this document, closing the cavities is made by a vacuum deposition without injecting gas, after setting the pressure. The pressure achievable with this type of structure is thus limited to about 1 mbar.

Document US 2007/0259470 A1 describes a packaging structure in which part of the sealing joint is formed by a permeable material the permeability of which can be modified as a function of the temperature to which the structure is subjected. Such a structure is however not suitable for making, on a same substrate, several cavities in which micro-devices are packaged under different atmospheres.

Document US 2012/0326248 A1 describes a packaging structure in which several micro-devices are packaged in different cavities. An aperture formed through the cap opens into a permeable material to inject gas into a cavity. The drawback of this packaging structure is in particular that the pressure differences between the different cavities are very limited because of the permeable material communicating the different cavities between each other. Furthermore, because of this permeable material present between the cavities, the gas tends, over time, to pass from one cavity to the other, and pressure values within the different cavities thus tend to change over time.

DISCLOSURE OF THE INVENTION

There is thus a need to provide a packaging structure including at east one cavity the atmosphere of which can be easily monitored, which is compatible with the packaging of several micro-devices in different cavities at different pressures which are stable over time, and enabling, between the atmospheres of these cavities, higher pressure differences than with structures of prior art.

For this, it is provided a packaging structure including at least:
- a cap secured to at least one first substrate and forming at least one cavity between the cap and the first substrate;
- a layer of at least one first material permeable to a gas, arranged in the cap and/or in the first substrate and/or at the interface between the cap and the first substrate, and forming at least one part of a wall of the cavity;
- a portion of at least one second material non-permeable to said gas, the thickness of which is higher than or equal to that of the layer of the first material, and surrounding at least one first part of the layer of the first material forming said part of the wall of the cavity;
- an aperture passing through the cap or the first substrate and opening onto or into said part of the layer of the first material.

Such a packaging structure enables the pressure with which the cavity can be closed to be set by varying several parameters:
- the dimensions of the aperture;
- the dimensions of the cavity;
- the dimensions of the part of the layer of the first material,
- the parameters for implementing the gas injection in the cavity through the aperture and the part of the layer of the first material.

Depending on these different parameters, it is thus possible to achieve very different pressures in the cavity. Thus, such a packaging structure is perfectly compatible with making several closed cavities with atmospheres very different from each other, for example with pressure differences ranging from several bars to about $10^{-4}$ mbar.

Furthermore, the portion of the second non-permeable material enables a good sealing of the cavity to be ensured, especially when several cavities are made adjacent to each other and the layer of the first material is common to these different cavities.

The advantage of this packaging structure is also to be manufacturable via standard MEMS manufacturing technologies, as well as via standard sealing technologies.

In this packaging structure, the layer of the first material, the portion of the second material and the aperture are arranged such that a gas injection in the cavity is possible through the aperture and the first part of the layer of the first material.

Such a packaging structure can be advantageously used for making a collective packaging of several micro-devices of different types and intended to be operated under different atmospheres, that is at different pressures and/or under different gas environments.

The term "gas" may here refer to a gas or a mixture of several gases formed from the chemical elements of the group 18 of the periodic table of elements, that is helium and/or neon and/or argon and/or krypton and/or xenon and/or radon, also called rare gases, or inert gases, or noble gases. Advantageously, the gas includes helium and/or argon.

The gas injected in the cavity through the first permeable material is a gas which is advantageously inert to the materials of the structure it can contact. This gas can in particular be a gas enabling the pressure to be set in the cavity and which is non-reactive to other materials of the structure.

Said part of the layer of the first material may surround the cavity. In this case, the portion of the second material may form a bead surrounding the cavity.

The packaging structure may further include at least one micro-device arranged in the cavity. The micro-device may be of the MEMS and/or NEMS and/or MOEMS and/or NOEMS-type. In particular, the micro-device may be of the inertial type, and correspond for example to an accelerometer or a gyrometer or a magnetometer, or also a pressure sensor.

The second material may be a metal (for example titanium and/or aluminium and/or copper) and/or the first material may include semiconductor oxide (for example $SiO_2$) and/or semiconductor nitride (for example SiNO or $Si_3N_4$) and/or glass (for example borosilicate-type glass, for example "Pyrex"-type, silica glass, or "borofloat"-type glass).

At least one part of the portion of the second material may be surrounded by a second part of the layer of the first material.

The portion of the second material may be arranged at least partly in the layer of the first material.

The cap may include at least one second substrate. In this case, the packaging structure corresponds to a "cap transfer"-type structure.

In a first embodiment, the layer of the first material and the portion of the second material may be arranged at the interface between the first substrate and the second substrate. Advantageously, the thickness of the portion of the second material may be higher than that of the layer of the first material.

In a second embodiment, the layer of the first material may be arranged between a support layer of the first substrate and an upper layer of the first substrate.

In this case, the upper layer of the first substrate may be a semiconductor layer in which the micro-device is made.

Furthermore, the second material may correspond to a semiconductor similar to that of the upper layer of the first substrate, and/or the first substrate may be of the SOI-type and the layer of the first material may correspond to the insulating layer of the first substrate.

The packaging structure may further include at least one plugging material arranged on and/or in the aperture such that the cavity is hermetically closed. The hermeticity of the cavity is thus jointly ensured by the material of the cap and the first substrate, the portion of the second material and the plugging material.

In this case, the aperture may pass through said part of the layer of the first material and open onto a portion of an electrically conducting material, and the plugging material may correspond to an electrically conducting layer arranged at least in the aperture and electrically connecting the portion of the electrically conducting material to an electrical contact arranged outside the aperture. Thus, the aperture used to set the packaging pressure of the cavity also acts to form a through-silicon via (TSV) electrically connecting the external electrical contact with the portion of the electrically conducting material which corresponds for example to an electrode of the micro-device.

A getter material may be arranged in the cavity. The function of such a getter material is to ensure the atmosphere quality by trapping residual gases such as, for example, oxygen, nitrogen, hydrogen, water, carbon monoxide and carbon dioxide, and thus achieve a vacuum in the cavity (pressure for example lower than about 1 mbar).

The packaging structure may include several cavities formed between the cap and the first substrate and arranged adjacent to each other, in which at least one dimension of each of the parts of the layer of the first material forming the parts of the wall of at least two of the cavities is different for each of said at least two of the cavities and/or in which a dimension of a cross-section of the aperture associated with each of at least two of the cavities is different. Different micro-devices can thus be packaged in the different cavities and under different atmospheres. It is for example possible that an inertial unit-type device including a gyrometer-type, an accelerometer-type and a magnetometer-type micro-devices are packaged in three different cavities of the packaging structure with pressures different from each other and suitable for the operation of each of these micro-devices.

The portions of the second material surrounding each of the parts of the layer of the first material forming the part of the wall of each of the cavities may be distinct from each other.

It is also provided a method for manufacturing a packaging structure, including at least the following steps of:
  making at least one cap and at least one first substrate intended to be secured to each other by forming at least one cavity between the cap and the first substrate;
  making a layer of at least one first material permeable to at least one gas, arranged in the cap and/or in the first substrate and/or at an interface between the cap and the first substrate, and for forming at least one part of a wall of the cavity;
  making at least one portion of at least one second material non-permeable to said gas, the thickness of which is higher than or equal to that of the layer of the first material, and surrounding at least one first part of the layer of the first material for forming said part of the wall of the cavity;
  securing the cap to the first substrate, forming the cavity;
  making at least one aperture passing through the cap or the first substrate and opening onto or into said part of the layer of the first material.

The manufacturing method may further include, after the step of making the aperture, a step of injecting said gas into the cavity through the aperture and said part of the layer of the first material, and then a step of hermetically closing the cavity by forming at least one plugging material on and/or in the aperture.

BRIEF DESCRIPTION OF THE DRAWINGS

The present invention will be better understood upon reading the description of exemplary embodiments given by way of purely indicating and in no way limiting purposes with reference to the appended drawings in which.

Identical, similar or equivalent parts of the different figures described hereinafter bear the same reference numerals so as to facilitate switching from one figure to the other.

The different parts shown in the figures are not necessarily drawn to a uniform scale, to make the figure more understandable.

The different possibilities (alternatives and embodiments) should be understood as being non-mutually exclusive and can be combined to each other.

DETAILED DISCLOSURE OF PARTICULAR EMBODIMENTS

Figure 1:
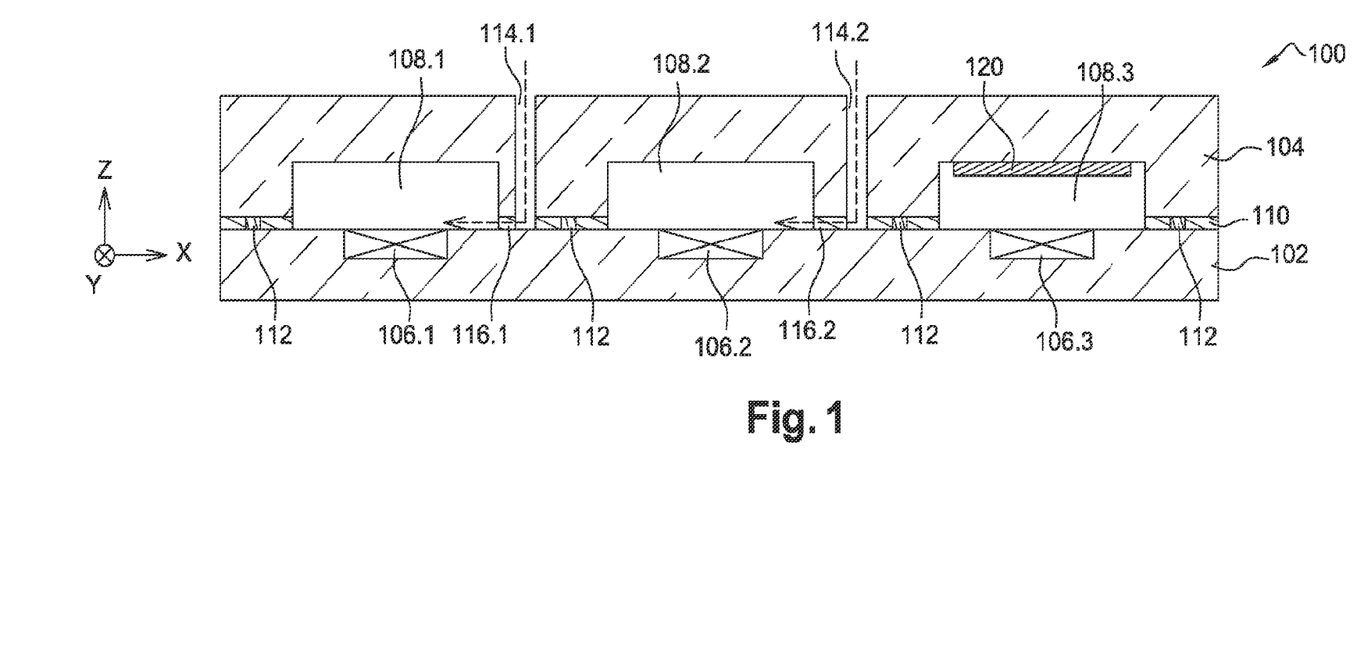
FIG. 1 to show a packaging structure according to a first embodiment.

FIG. 1 is first referred to which shows a cross-section view of a profile of a packaging structure 100 according to a first embodiment.

The packaging structure 100 is herein formed by assembling a first substrate 102 with a second substrate 104. Both these substrates 102 and 104 each include a material non-permeable to a gas, advantageously a noble gas (corresponding to one type of noble gas or a mixture of different types of noble gases) to be injected in cavities of the structure 100, for example a semiconductor such as silicon.

One or more micro-devices 106 are made in and/or on the first substrate 102 which is used as a support for these micro-devices 106. In the example of FIG. 1, three micro-devices 106.1, 106.2 and 106.3 are made at a front face of the first substrate 102. The micro-devices 106 are each packaged in a cavity 108 (referenced 108.1, 108.2 and 108.3 in FIG. 1 respectively for each of the micro-devices 106.1, 106.2 and 106.3) formed between both substrates 102, 104. In this first embodiment, the cavities 108 are formed in a thickness part of the second substrate 104 which forms the cap of the structure 100.

The substrates 102 and 104 are secured to each other. A layer 110 is arranged at the interface between the substrates 102 and 104, at the periphery of the cavities 108. This layer 110 is formed by at least one first material which is permeable to a gas, such as helium and/or argon, intended to be injected in the cavities 108. The first material includes for example $SiO_2$ and/or one or more components derived from $SiO_2$ such as SiON or SiOC, deposited as a thin layer, for example with a thickness between about 10 nm and 10 μm. The layer 110 may also include silicon nitride and/or glass.

Figure 2:
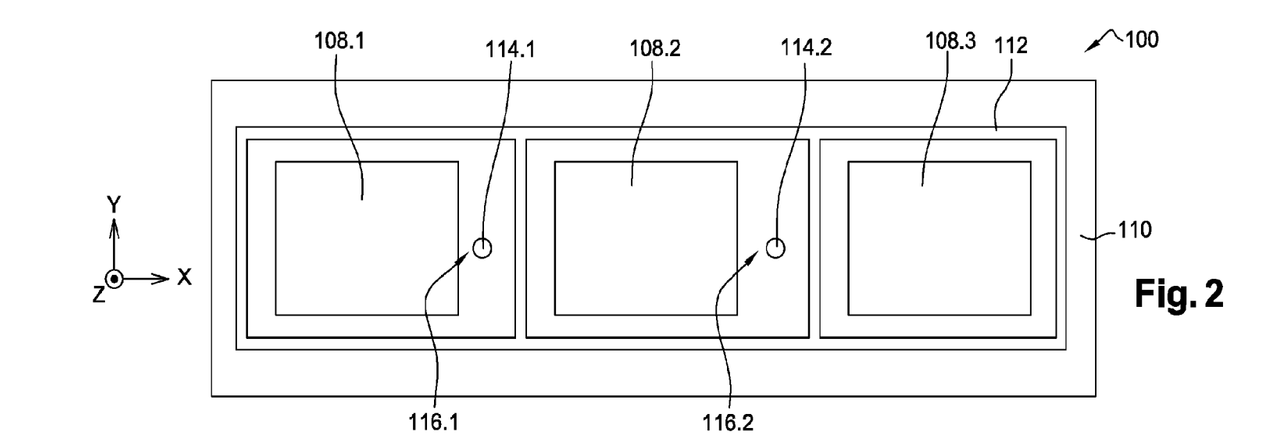

A portion 112 of at least one second material non-permeable to the gas intended to be injected in the cavities 108 is formed in the layer 110. Here, the upper faces of the portion 112 and of the layer 110 form a continuous surface, and the lower faces of the portion 112 and of the layer 110 also form a continuous surface. This portion 112 is made here as a bead surrounding each of the cavities 108. The portion 112 is for example formed by one or more superimposed metal layers, for example of titanium and/or aluminium and/or copper and/or gold and/or germanium. The thickness of the portion 112 is higher than or equal (equal in the example of FIG. 1) to that of the layer 110, and for example between about 0.2 μm and 10 μm. Thus, because the materials of the substrates 102 and 104 and of the portion 112 are non-permeable to the gas intended to be injected in the cavities 108, the atmospheres of the cavities 108 are well insulated from each other by the materials. Without the presence of the portion 112, the atmospheres of the cavities 108 would communicate with each other through the material of the layer 110 which is permeable to the injected gas. FIG. 2 shows a top cross-section view of the layer 110 and of the portion 112.

In order to enable the gas to be injected in the cavities 108, apertures 114 are formed through the second substrate 104, at the side walls of the cavities 108. The apertures 114 have for example here, in the plane parallel to the front face of the first substrate 102, circular-shaped cross-sections. The apertures 114 are preferably extended through the layer 110. Each of the apertures 114 is made such that it opens onto or into a part of the layer 110 which is delimited by the portion 112 and which communicates with one of the cavities 108. In the examples of FIGS. 1 and 2, a first aperture 114.1 is made such that it opens into a part 116.1 of the layer 110 which is delimited by the portion 112 and which communicates with the first cavity 108.1. Thus, the gas injected in the first aperture 114.1 passes through this part 116.1 of the layer 110 which separates the first aperture 114.1 from the first cavity 108.1. A second aperture 114.2 is made such that it opens into a part 116.2 of the layer 110 which is delimited by the portion 112 and which communicates with the second cavity 118.2. Thus, the gas injected in the second aperture 114.2 passes through this part 116.2 of the layer 110 which separates the second aperture 114.2 from the second cavity 118.2. Finally, for the third cavity 108.3, no aperture is herein formed to open onto or into a part of the layer 110 communicating with the third cavity 108.3.

In the example of FIG. 1, the portion 112 is surrounded by a second part of the layer 110 corresponding to the external part of the layer 110.

The amount of injected gas in each cavity 108 depends on several parameters:
- the dimensions (for example the diameter in the case of an aperture having a circular cross-section) of the cross-section of the aperture 114 associated with the cavity;
- the dimensions of the part 116 of the layer 110 of permeable material located between the aperture 114 and the cavity 108, that is the length (dimension along the axis X in FIGS. 1 and 2) and the cross-section (width×thickness) of the portion of permeable material through which the gas has to pass before ending in the cavity 108;
- the gas injection parameters, that is the pressure with which the gas is injected as well as the duration of this gas injection.

In the example of FIGS. 1 and 2, the apertures 114.1 and 114.2 have substantially similar diameters. Furthermore, the gas injection is simultaneously made in the cavities 108.2 and 108.2 during a same step by arranging the packaging structure 100 in an enclosure in which a gas is present at a certain pressure, for example between about 0.5 bar and 10 bars, and for a duration defined as a function of the pressure in the enclosure and the desired pressure in the cavities, for example between about a few minutes and a few hours. Further, because the thickness of the layer 110 is substantially constant at the entire packaging structure 100, the cross-sections of the parts 116.1 and 116.2 of the layer 110 through which the gas passes to end in the cavities 108.1 and 108.2 are the same. On the other hand, the apertures 114.1 and 114.2 are made at different distances from the cavities 108.2 and 108.2. Thus, the length of the part 116.1 of the layer 110 through which the gas passes to end in the first cavity 108.1 is lower than that through which this gas passes to end in the second cavity 108.2, which results, after the implementation of the gas injection step, in a residual pressure of this gas in the first cavity 108.1 higher than that in the second cavity 108.2.

Figure 3:
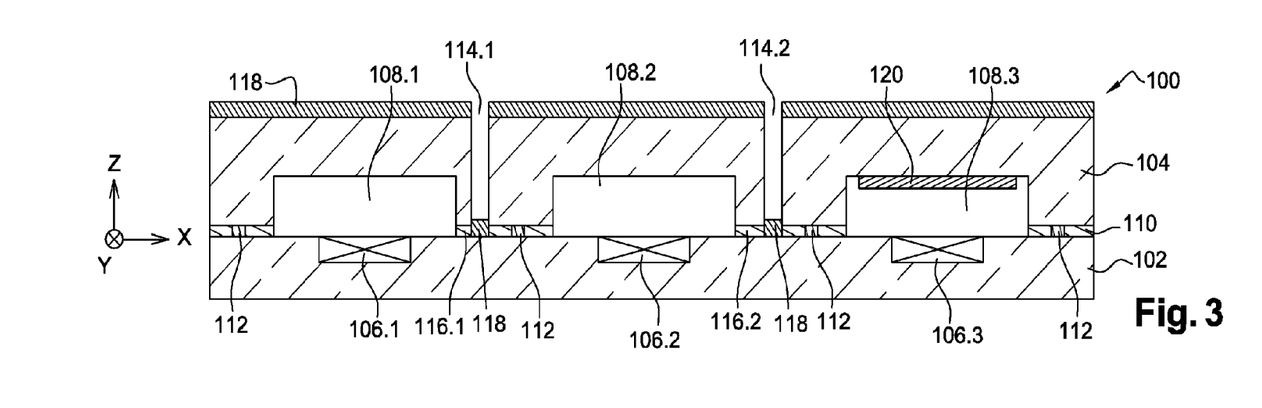

After this step of injecting gas in the cavities 108.1 and 108.2, these cavities are hermetically closed again by plugging the apertures 114.1 and 114.2 via depositing a plugging material, herein as a layer 118, at least in the apertures 114.1 and 114.2, the thickness of the layer 118 being here advantageously higher than or equal to the thickness of the layer 110 such that the parts 116.1 and 116.2 of the layer 110 through which the gas has been injected in the cavities 108.1 and 108.2 are no longer in contact with the atmosphere external to the cavities 108.1 and 108.2. In the case of a plugging material 118 conformably deposited into the apertures 114, the thickness of this plugging material 118 can be low and in particular lower than the thickness of the layer 110 because such a conform deposition enables the walls of the apertures 114 to be covered for making the cavities 108 hermetic without necessarily filling the apertures 114. When the apertures 114 are made through a part of the thickness of the layer 110, the plugging layer 118 is then made with a thickness higher than or equal to that of this part of the thickness of the layer 110. Finally, if the apertures 114 are made such that they open onto the layer 110 without passing through it, then the thickness of the plugging layer 118 is chosen at least equal to the minimum thickness ensuring a hermetic closure of the apertures 114, this minimum thickness depending in particular on the material(s) used for making the layer 118. In the example of FIG. 3, the layer 118 is deposited into the apertures 114 but also onto the second substrate 104.

Thanks to the impermeability achieved between the different cavities 108 of the structure 100, it is for example possible to achieve in one of the cavities 108 a final pressure close to 1 bar, or even of more than 1 bar, and in an adjacent cavity, a very low pressure, for example lower than about $10^{-1}$ mbar, and this thanks in particular to the portion 112 non-permeable to the gas and formed in the layer 110.

In the example of FIGS. 1 and 2, the cavities 108 have dimensions substantially similar to each other. Alternatively, it is possible that the cavities 108 have different dimensions from each other.

In the previously described structure 100, a portion of getter material 120 is arranged in the third cavity 108.3. This portion of getter material 120 is for making a gas absorption in order to reduce the pressure within the third cavity 108.3. Thus, in the previously described packaging structure 100, the pressure within the first cavity 108.1 is higher than that within the second cavity 108.2 which is in turn higher than that within the third cavity 108.3. In this example, because no gas is injected in the third cavity 108.3 and by virtue of the presence of the getter material 120, it is possible to achieve in the third cavity 108.3 a very low residual pressure for example lower than or equal to about 1 mbar, or even a vacuum level that can range up to about $10^{-3}$ mbar, or even $10^{-4}$ mbar. The pressure within the first cavity 108.1 is for example higher than or equal to about 1 bar. The pressure within the second cavity 108.2 is for example between about 10 mbars to a few hundred mbars (<1 bar).

Alternatively, it is possible that portions of getter material are also arranged in one or more of the other cavities 108 of the structure 100.

The assembly of the second substrate 104 to the first substrate 102 may correspond, for example, to a molecular, anodic, metal or sintered glass sealing. The nature of the layer 110 depends in particular on the sealing type made. The sealing made is however compatible with the presence of a layer of material permeable to the gas to be injected in the cavities 108. This assembly may be made or not under a particular atmosphere such that a particular gas composition and/or pressure are present in the cavities 108 before the gas injection step. The choice of a particular atmosphere upon assembling both substrates 102, 104 may in particular be made as a function of the desired atmosphere in the cavity(es) 108 which are not intended to be subjected to a gas injection (as the cavity 108.3 in the example described here).

Alternatively to the example described in connection with FIGS. 1 and 2, it is possible that the apertures 114.1 and 114.2 are made at substantially similar distances from the cavities 108.1 to 108.2 such that the length of the part 116.1 of the layer 110 through which the gas passes to end in the first cavity 108.1 is substantially similar to that through which this gas passes to end in the second cavity 108.2. In this case, a pressure difference in the cavities 108.1 and 108.2 can be achieved by making the apertures 114.1 and 114.2 with different dimensions with respect to the other (with different diameters in the case of apertures 114 having a circular cross-section, or with sides with different dimensions in the case of apertures 114 having a cross-section with a shape other than circular, for example polygonal). A pressure difference in the cavities 108.1 and 108.2 can also be achieved by making the layer 110 such that the different parts 116 of this layer through which the gas is intended to pass have no similar widths, this gas thus passing through portions 116 of permeable material having different cross-sections.

Figure 4:
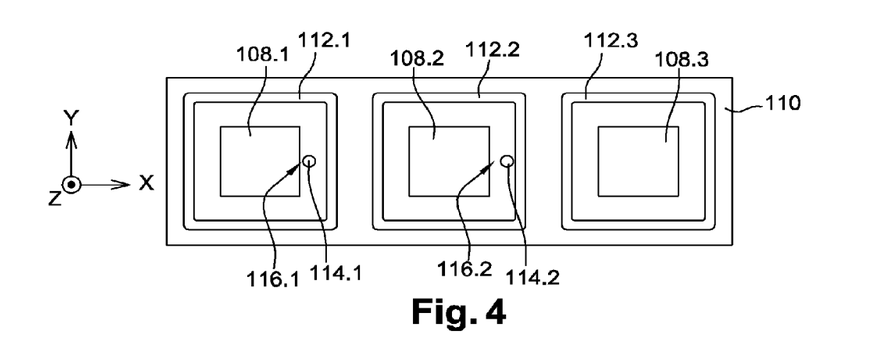
FIG. 4 shows a part of a packaging structure according to an alternative of the first embodiment.

In the previously described first embodiment, a single portion 112 separates two adjacent cavities 108. Alternatively, it is possible that several portions 112 of material non-permeable to the gas injected in the cavities 108 are made in the layer 110, such that each portion 112 surrounds one of the cavities 108. In the example of FIG. 4, each of the cavities 108.1, 108.2 and 108.3 is surrounded by a portion 112 which are respectively referenced 112.1, 112.2 and 112.3 and each forming a bead of material non-permeable to the gas surrounding each of the cavities. Thus, two adjacent cavities 108 are separated from each other by two distinct portions 112 of non-permeable material. Such a configuration of the non-permeable material into several distinct beads is advantageous to make, after plugging the cavities 108, a cutting of the substrates 102, 104 in order to form individual chips each including one of the micro-devices 106. The configuration previously described in connection with FIG. 1 is on the other hand enough when the third micro-devices 106.1-106.3 are not intended to be separated from each other as individual chips.

The steps of a method for manufacturing the structure 100 are described below in connection with FIGS. 5A to 5I. In these figures, a single cavity 108 is shown, although the structure 100 may include several cavities 108 in which several micro-devices 106 are packaged.

Figure 5A:
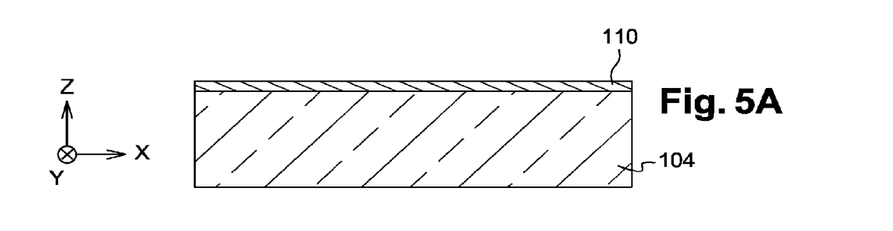
FIGS. 5A to 5I show the steps of a method for manufacturing the packaging structure according to the first embodiment.

The layer 110 of permeable material is first deposited onto the face of the second substrate 104 which is intended to be arranged on the side of the first substrate 102 (FIG. 5A). The layer 110 includes for example $SiO_2$ and may be made by thermal (dry or wet) oxidation of the second substrate 104 when the same includes silicon, or by PECVD.

Figure 5B:
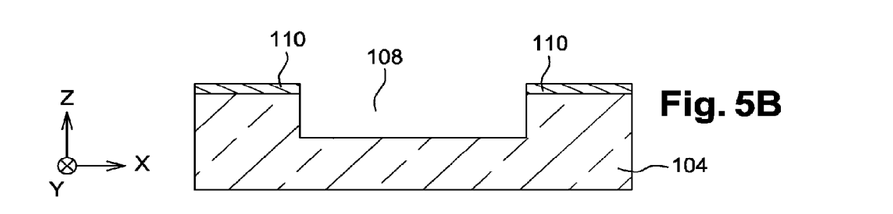

The cavity 108 is then made through the layer 110 and in a part of the thickness of the second substrate 104, for example through dry or wet etching (FIG. 5B).

Figure 5C:
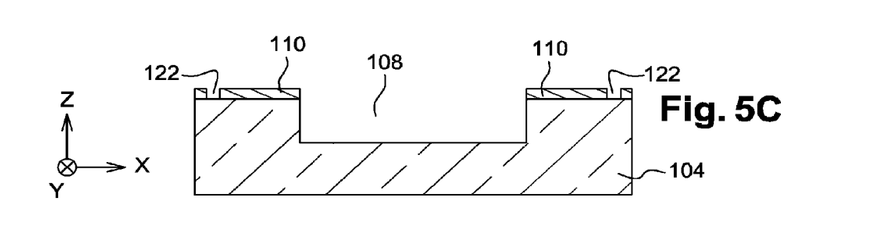

The layer 110 is then locally etched, at the periphery of the cavity 108, in order to form in the layer 110 a location 122 in which the portion 112 of material non-permeable to the gas is intended to be made thereafter (FIG. 5C). The location 122 forms for example a trench surrounding the cavity 108.

Figure 5D:
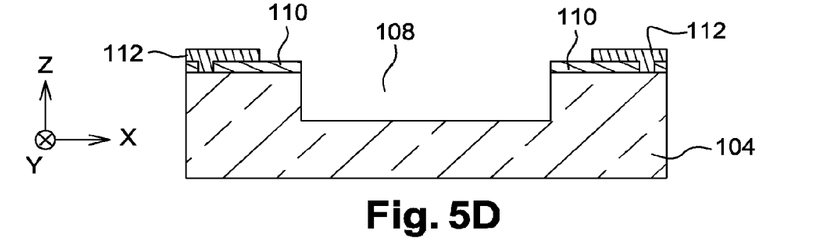

The portion 112 is then made by depositing into the location 122 the material(s) non-permeable to the gas to be injected in the cavity 108, for example a deposition of one or more metal layers into the location 122. In the example of FIG. 5D, the material(s) forming the portion 122 is (are) deposited into the location 122 but also advantageously next to this location, on a part of the layer 110, that is with a width (dimension along the axis X) higher than that of the location 122. This portion 112 is for example formed by one or more metal layers deposited by PVD, and then shaped by etching. It is however possible that the portion 112 is made with a width similar to that of the location 122, as is the case in previously described FIGS. 1 to 4, even with a width lower than that of the location 122. The portion 112 is thus here partly arranged into the layer 110.

Figure 5E:
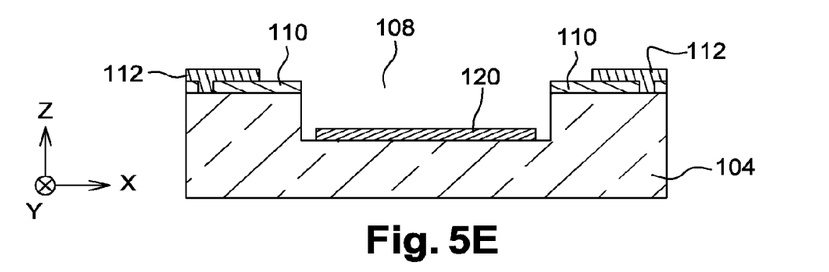

As shown in FIG. 5E, a portion of getter material 120 may be deposited onto the bottom wall of the cavity 108, in particular when the cavity 108 is intended to include a gas residual pressure lower than about 1 mbar once it is hermetically closed.

Alternatively to the steps previously described in connection with FIGS. 5B and 5E, it is possible to make, directly after depositing the layer 110, the local etching of the layer 110 forming the location 122, and then forming the portion 112, and finally performing the etching of the cavity 108 through the layer 110 and a part of the thickness of the second substrate 104.

Figure 5F:
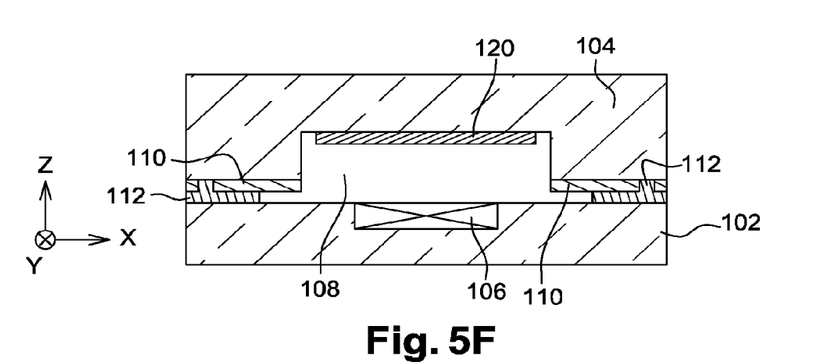

The obtained cap shown in FIG. 5E is then assembled to the first substrate 102 including the micro-device(s) 106, for example by a metal sealing (heat compression or eutectic), as shown in FIG. 5F. Because the portion 112 has been previously made such that it is deposited into the location 122 but also that it covers a part of the layer 110, the material of the cap in contact with the first substrate 102 corresponds to the material of the portion 112 which thus acts as a sealing joint. The assembly between the first substrate 102 and the second substrate 104 is ensured both by the portion 112 and the layer 110.

Figure 5G:
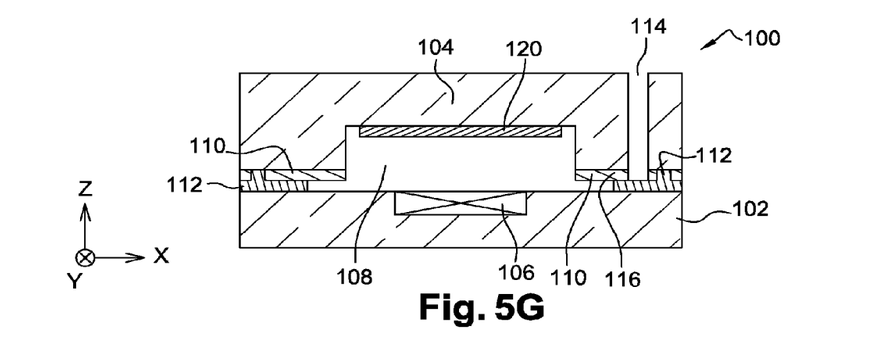

The aperture 114 is then made by etching through the second substrate 104 and the layer 110 such that it opens into the part of the layer 110 which is delimited by the portion 112 (FIG. 5G). As previously described, the aperture 114 may pass through the entire thickness of the layer 110 (and open onto the first substrate 102 or a part of the material of the portion 112 as is the case in FIG. 5G), or a part of the thickness of the layer 110, or also not pass through the layer 110 and directly open onto the same.

Figure 5H:
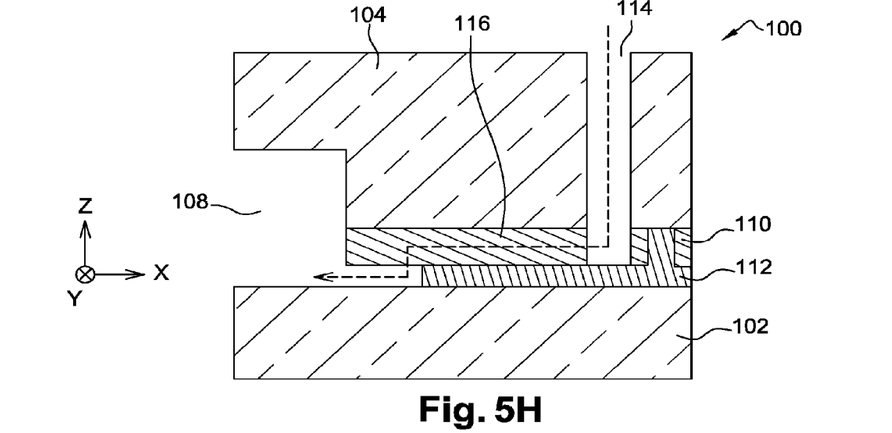

The gas is then injected into the cavity 108 via the aperture 114 and the part 116 of the layer 110 which is arranged between the inside of the cavity 108 and the aperture 114 and which forms a channel of a material permeable to this gas. The gas path during this injection step is represented in dotted lines in FIG. 5H. FIG. 5H well illustrates the fact that the gas injected in the aperture 114 can pass only through the channel formed by the part 116 of the layer 110 and that this gas is blocked in the other direction by the portion 112. Thus, adjacent cavities are not impacted by the permeation of the gas passing through the aperture 114.

Figure 5I:
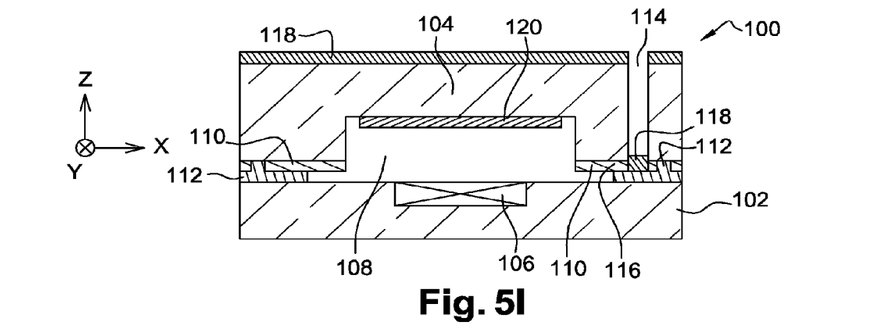

As shown in FIG. 5I, the structure 100 is completed by plugging the aperture 114 by depositing the layer of the plugging material 118 in the aperture 114, and here also on the second substrate 104.

A method for making the packaging structure 100 according to a second embodiment is described below in connection with FIGS. 6A to 6K.

This second embodiment differs from the first embodiment in that the gas is intended to be injected into the cavities through apertures and channels made in the first substrate including the micro-devices. As for previous FIGS. 5A to 5I, a single cavity 108 is shown in FIGS. 6A to 6K, even though the structure 100 may include several cavities 108 in which several micro-devices 106 are packaged.

Figure 6A:
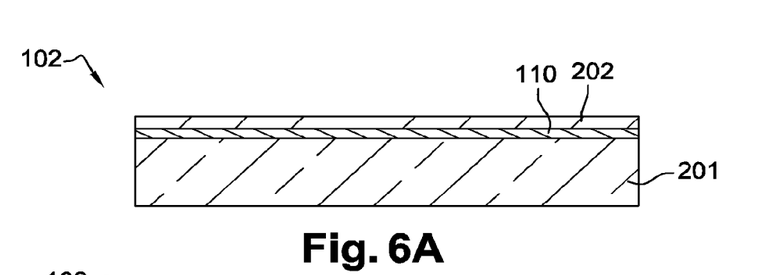
FIGS. 6A to 6K show the steps of a method for manufacturing a packaging structure according to a second embodiment.

In this second embodiment, the structure 100 is made from a first substrate 102 of the SOI (Silicon On Insulator)-type, or more generally of a semiconductor on insulator-type, including a solid layer 201, or support layer, the layer 110 arranged on the layer 201 and corresponding to the buried insulating layer (BOX) of the SOI substrate and the material of which ($SiO_2$ for example) is permeable to the gas intended to be injected in the cavities of the packaging structure 100, and a superficial layer, or upper layer, of semiconductor 202, here silicon, arranged on the layer 110 and the thickness of which is for example lower than about 1 μm (FIG. 6A).

Figure 6B:
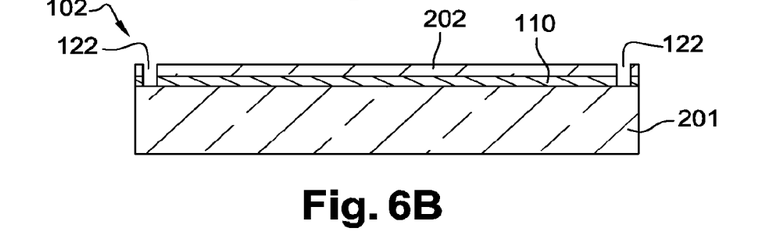

The location 122 of the portion 112 intended to hermetically close the cavity 108 at the layer 110 is then etched through the layers 202 and 110 (FIG. 6B).

Figure 6C:
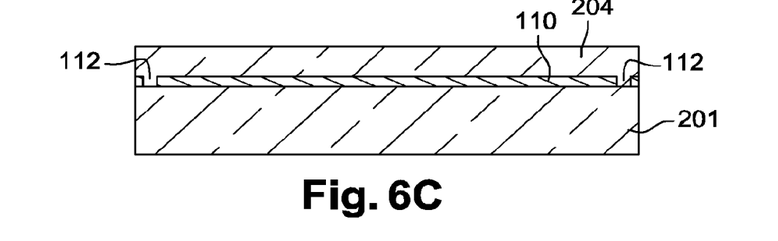

As shown in FIG. 6C, a thick semiconductor layer of the same nature as that of the layer 202 is then formed on the layer 202 and in the previously made location 122. This step is for example made by deposition, for example through epitaxy, and for example with a thickness corresponding to the desired semiconductor thickness for making the micro-device 106, for example between about 2 μm and 100 μm. The layer 202 and the deposited semiconductor form together a semiconductor layer 204 arranged on the layer 110 and, in the location 122, the deposited semiconductor forms the portion 112 of material non-permeable to the gas.

Figure 6D:
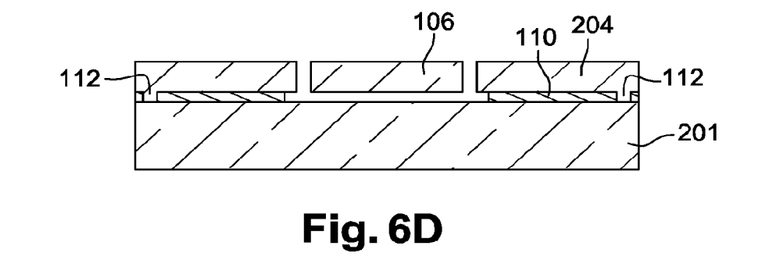

The layer 204 is then structured by etching to obtain the micro-device 106, typically by deep etching of the semiconductor of the layer 204 and then releasing the micro-device 106 by etching, for example wet etching, parts of the layer 110 to which the micro-device 106 is secured (FIG. 6D).

A substrate of another type than the SOI substrate may be used for making the micro-device 106. It is for example possible to use a semiconductor solid (of the bulk type) substrate, forming the first substrate 102, on which the layers 110 and 202 are made by successive depositions. It is also possible to use a BSOI (Bonded SOI)-type substrate the feature of which is to have a very thick semiconductor upper layer (typically between about 10 μm and 100 μm). However, the advantage of the use of an SOI substrate including a thin surface layer is, with respect to the use of a BSOI-type substrate, to facilitate the creation of the locations 122 and plugging these locations with semiconductor because of the thinness of the surface layer 202.

Figure 6E:
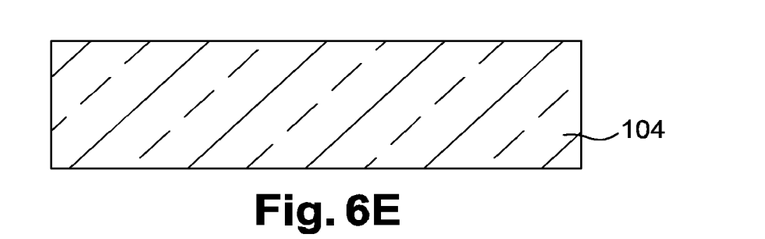

In parallel to making the layer 110 and the micro-device 106 on the first substrate 102, the cap of the packaging structure 100 is made from the second substrate 104 (FIG. 6E).

Figure 6F:
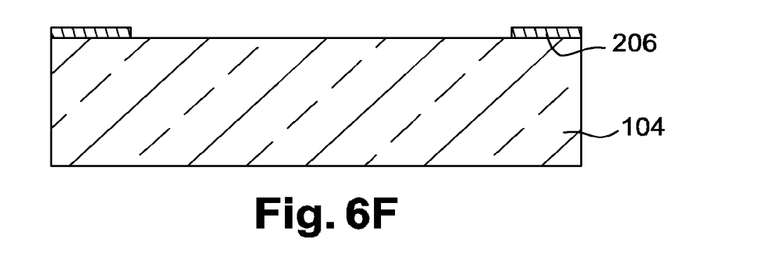

A sealing bead 206, for securing the second substrate 104 to the first substrate 102, is then made on one of the faces of the second substrate 104 (FIG. 6F). The sealing bead 206 for example includes one or more metal materials when the securement between the substrates 102 and 104 is to be made by metal sealing.

Figure 6G:
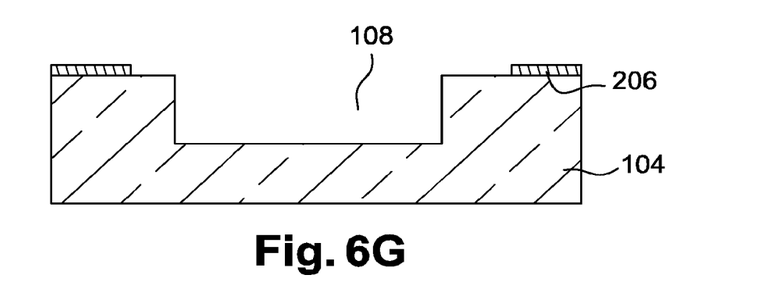

The cavity 108 is then made through the second substrate 104 (FIG. 6G).

Figure 6H:
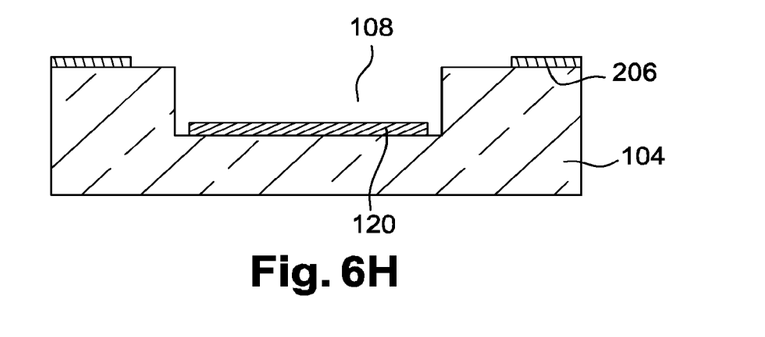

A portion of getter material 120 may be made in the cavity 108, in particular when the pressure desired in the cavity 108 after hermetically closing the same is lower than about 1 mbar (FIG. 6H).

Figure 6I:
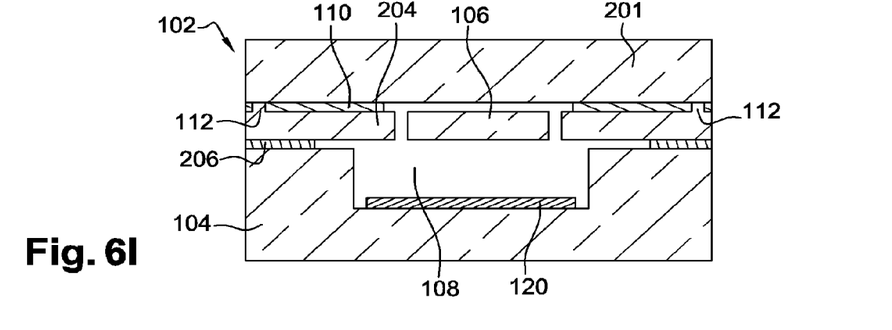

The cap thus obtained is assembled to the first substrate 102, and more precisely to the layer 204, for example by a metal-type (heat compression or eutectic) sealing method, via the sealing bead 206 (FIG. 6I).

Figure 6J:
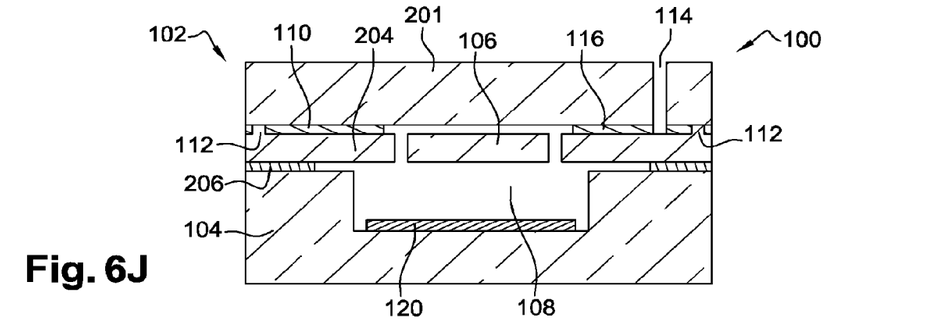
Figure 6K:
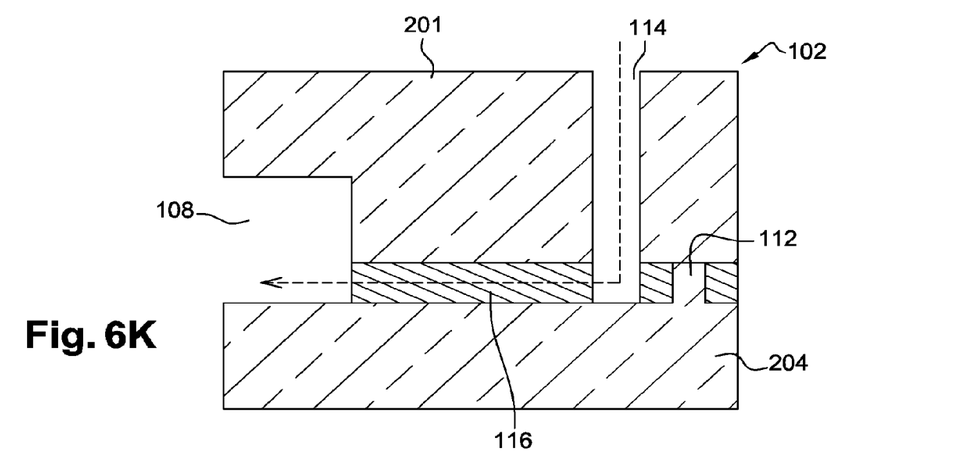

The aperture 114 is then made from the back face of the first substrate 102, through the layer 201 and the layer 110 such that the aperture 114 opens onto or into the part of the layer 110 which is surrounded by the portion 112 (FIG. 6J).

The gas is then injected into the aperture 114. The gas path in the aperture 114 and in the part 116 of the layer 110 through which the gas is intended to pass is represented in dotted lines in FIG. 6K. As previously, the gas residual pressure achieved in the cavity 108 depends on the dimensions of the cross-section of the aperture 114, on the geometry of the part 116 (length and cross-section) as well as on the pressure and on the duration with which the gas is sent into the aperture 114.

After injecting the gas into the cavity 108, the packaging structure 100 is plugged by depositing the layer of plugging material 118, as previously described for the first embodiment, that is at least in the aperture 114 and possibly on the entire back face of the first substrate 102.

Regardless of the embodiment of the packaging structure 100, the aperture 114 made through the first substrate 102 or through the second substrate 104 can further be used for making a conducting via (or TSV, that is "Through Silicon Via"). FIGS. 7A to 7E show part of the steps of a method for manufacturing the packaging structure 100 according to an alternative of the second embodiment in which the aperture 114 is used for making a conducting via. In FIGS. 7A to 7E, the packaging structure 100 is only partly shown.

Figure 7A:
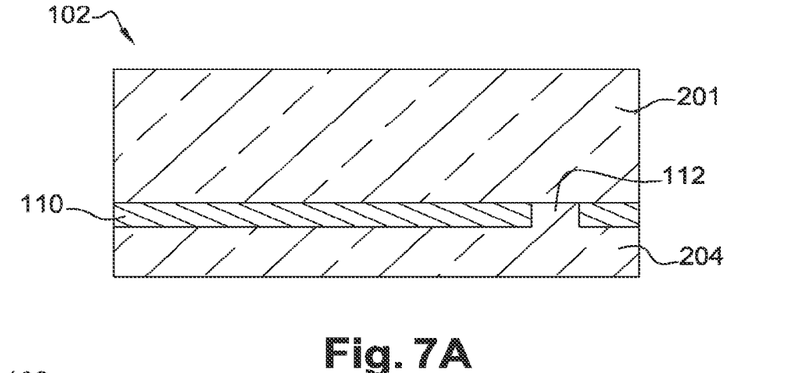
FIGS. 7A to 7E show a part of the steps of the method for manufacturing the packaging structure according to the second embodiment.

The steps previously described in connection with FIGS. 6A to 6I are first implemented. In FIG. 7A, a part of the structure 100 in which the aperture will be made is shown.

Figure 7B:
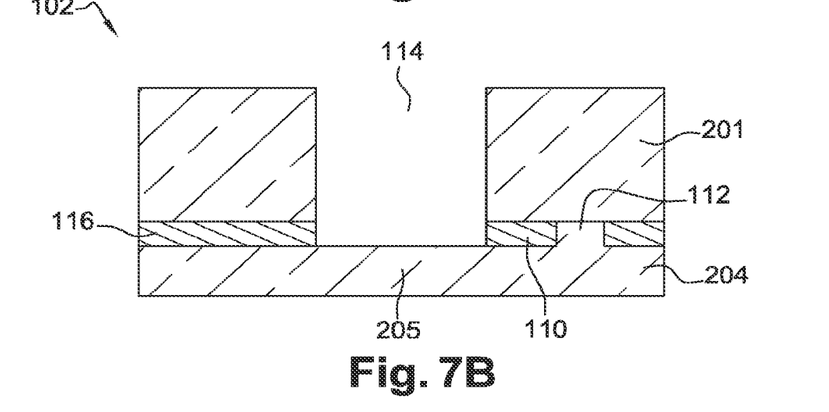

The aperture 114 is then made from the back face of the first substrate 102, through the layer 201 and the layer 110, such that it opens onto a part 205 of the layer 204 forming an electrode of the micro-device 106 (FIG. 7B).

Figure 7C:
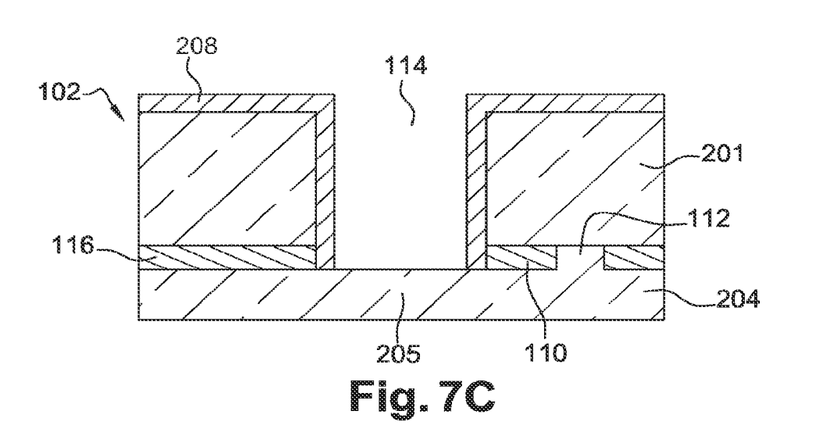

A passivation layer 208 is then formed, for example by conformably depositing oxide on the layer 201 and onto the side walls of the aperture 114 (FIG. 7C). The part of the passivation layer 208 initially deposited onto the bottom wall of the aperture 114, that is on the part 205 forming an electrode of the micro-device 106, is removed, for example by etching, in order to make this electrode accessible from the aperture 114.

A gas is then injected into the cavity 108 through the aperture 114 and the part 116 of the layer 110.

Figure 7D:
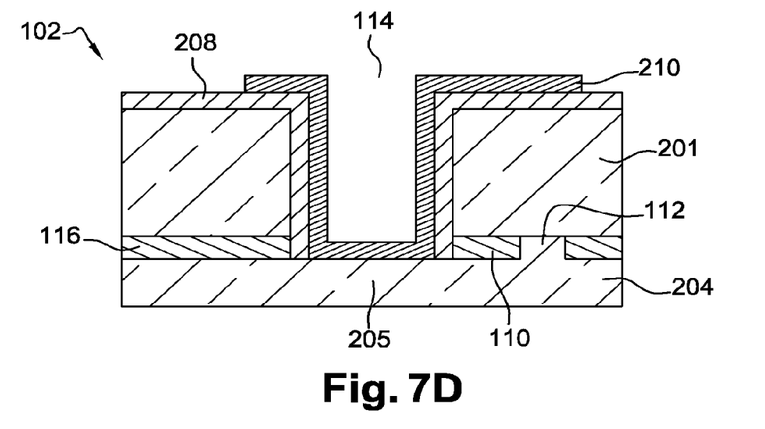

An electrically conducting, for example metallic, layer 210, is then formed on a part of the passivation layer 208 located on the external face of the layer 201 and on the part 205 of the layer 204 (FIG. 7D). The layer 210 thus forms an electrical connection between the part 205 and one of the external faces of the structure 100 (here at the back face of the first substrate 102). The layer 110 also acts as a screen towards the gas injected into the cavity 108 and thus hermetically plugs the cavity 108.

Figure 7E:
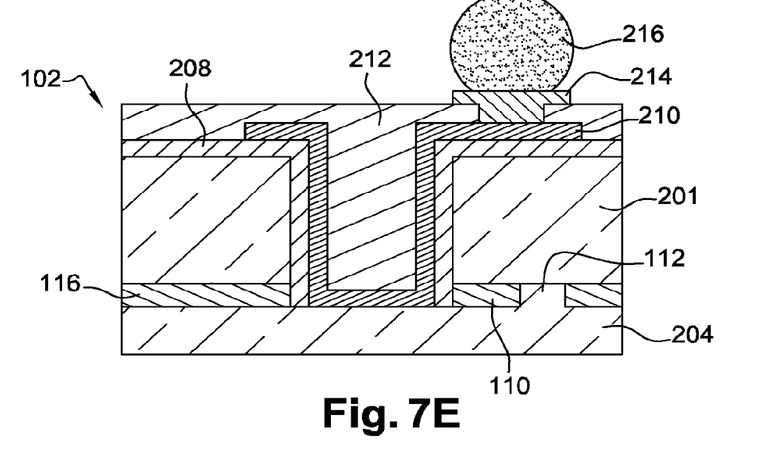

The structure 100 is then completed by depositing a second passivation layer 212 covering the electrically conducting layer 210. An aperture is then formed through the second passivation layer 212, facing a part of the layer 210 at which an electrical contact recovery is intended to be made. A metallization 214 is then made in this aperture and a connecting ball 216, acting as an electrical contact for the part 205, is formed on the metallization 214.

The invention claimed is:

1. A packaging structure comprising:
a cap secured to at least one first substrate and forming at least one cavity between the cap and the first substrate;
a layer of at least one first material permeable to a gas, arranged in the cap and/or in the first substrate and/or at an interface between the cap and the first substrate, and forming at least one part of a wall of the cavity;
a portion of at least one second material non-permeable to said gas, the thickness of which is higher than or equal to that of the layer of the first material, and surrounding at least one first part of the layer of the first material forming said part of the wall of the cavity; and
an aperture passing through the cap or the first substrate and opening onto or into said part of the layer of the first material.

2. The packaging structure according to claim 1, wherein said part of the layer of the first material surrounds the cavity.

3. The packaging structure according to claim 1, further including at least one micro-device arranged in the cavity.

4. The packaging structure according to claim 1, wherein the second material is a metal.

5. The packaging structure according to claim 1, wherein the first material includes at least one of the following elements: semiconductor oxide, semiconductor nitride, and glass.

6. The packaging structure according to claim 1, wherein at least one part of the portion of the second material is surrounded by a second part of the layer of the first material.

7. The packaging structure according to claim 1, wherein the cap includes at least one second substrate.

8. The packaging structure according to claim 7, wherein the layer of the first material and the portion of the second material are arranged at an interface between the first substrate and the second substrate.

9. The packaging structure according to claim 1, wherein the layer of the first material is arranged between a support layer of the first substrate and an upper layer of the first substrate.

10. The packaging structure according to claim 3, wherein the layer of the first material is arranged between a support layer of the first substrate and an upper layer of the first substrate, wherein the upper layer of the first substrate is a semiconductor layer in which the micro-device is made.

11. The packaging structure according to claim 10, wherein the second material corresponds to a semiconductor similar to that of the upper layer of the first substrate.

12. The packaging structure according to claim 1, wherein the first substrate is of an SOI-type and the layer of the first material corresponds to the insulating layer of the first substrate.

13. The packaging structure according to claim 1, further comprising at least one plugging material arranged on and/or in the aperture such that the cavity is hermetically closed.

14. The packaging structure according to claim 13, wherein the aperture passes through said part of the layer of the first material and opens onto a portion of electrically conducting material, and the plugging material corresponds to an electrically conducting layer arranged at least in the aperture and electrically connecting the portion of the electrically conducting material to an electrical contact arranged outside the aperture.

15. The packaging structure according to claim 1, further comprising several cavities formed between the cap and the first substrate and arranged adjacent to each other, wherein at least one dimension of each of the parts of the layer of the first material forming the parts of the wall of at least two of the cavities is different for each of said at least two of said cavities and/or wherein a dimension of a cross-section of the aperture associated with each of at least two of the cavities is different.

16. The packaging structure according to claim 15, wherein the portions of the second material surrounding each of the parts of the layer of the first material forming the part of the wall of each of the cavities are distinct from each other.

17. A method for manufacturing a packaging structure, the method comprising:
making at least one cap and at least one first substrate for being secured to each other by forming at least one cavity between the cap and the first substrate;
making a layer of at least one first material permeable to at least one gas, arranged in the cap and/or in the first substrate and/or at an interface between the cap and the first substrate, and for forming at least one part of a wall of the cavity;
making at least one portion of at least one second material non-permeable to said gas, the thickness of which is higher than or equal to that of the layer of the first material, and surrounding at least one first part of the layer of the first material for forming said part of the wall of the cavity;
securing the cap to the first substrate, forming the cavity; and
making at least one aperture passing through the cap or the first substrate and opening onto or into said part of the layer of the first material.

18. The manufacturing method according to claim 17, further comprising, after the making of the aperture, injecting said gas into the cavity through the aperture and said part of the layer of the first material, and then hermetically closing the cavity by forming at least one plugging material on and/or in the aperture.

* * * * *